United States Patent [19]

Meinke et al.

[11] 3,942,119
[45] Mar. 2, 1976

[54] MULTIPLE-TRANSMISSION-CHANNEL ACTIVE ANTENNA ARRANGEMENT

[75] Inventors: Hans Heinrich Meinke, Gauting; Heinz Lindenmeier, Planegg; Fritz Landstorfer; Gerhard Flachenecker, both of Munich, all of Germany

[73] Assignee: Hans Kolbe & Co., Bad Salzdetfurth, Germany

[22] Filed: Feb. 27, 1974

[21] Appl. No.: 446,533

[30] Foreign Application Priority Data

Mar. 2, 1973 Germany............................ 2310616

[52] U.S. Cl. ............... 325/308; 325/383; 325/385; 343/852
[51] Int. Cl.² ....................... H04B 1/18; H01Q 1/50
[58] Field of Search ........... 325/376, 308, 365, 373, 325/371, 374, 383, 385; 343/852, 858

[56] References Cited
UNITED STATES PATENTS

| | | | |
|---|---|---|---|
| 1,976,909 | 10/1934 | Amy | 325/308 |
| 2,280,461 | 4/1942 | Whisk | 325/371 |
| 3,465,344 | 9/1969 | Scott et al. | 325/308 |
| 3,582,791 | 6/1971 | Slavin et al. | 325/373 |
| 3,633,109 | 1/1972 | Schulz | 325/373 |

*Primary Examiner*—George H. Libman
*Attorney, Agent, or Firm*—Michael J. Striker

[57] ABSTRACT

An antenna has two output terminals and is operative for receiving electromagnetic radiation and converting the same into electrical signals appearing across the two antenna output terminals. There are provided a first and a second transmission channel, each having a respective input comprised of a pair of input terminals, and respectively operative for transmitting electrical signals having frequencies lying in a predetermined first frequency range and in a predetermined higher second frequency range, one of the input terminals of the first channel being connected to one of the two antenna output terminals. A transformer includes a primary winding connecting the other of the input terminals of the first channel to the other of the two antenna output terminals. The transformer further includes a secondary winding connected across the two input terminals of the second transmission channel. The transformer is operative when the frequency of the electrical signal across the antenna output terminals is in the aforementioned first range for stepping down the input impedance of the second channel as reflected into the circuit of the primary winding to a value lower than the value of the input impedance of said first transmission channel at such frequency.

24 Claims, 16 Drawing Figures

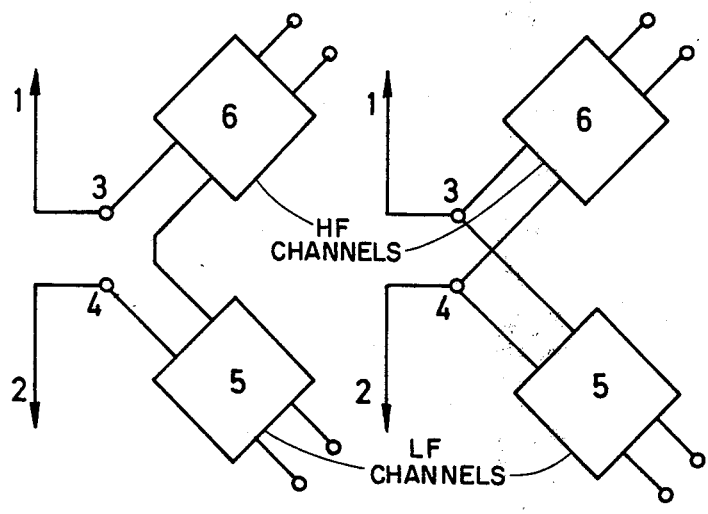
Fig. 1
PRIOR ART
Fig. 2
PRIOR ART
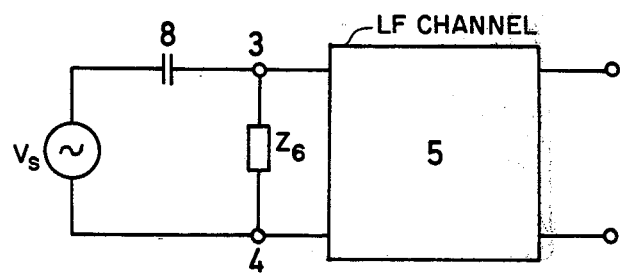
Fig. 3

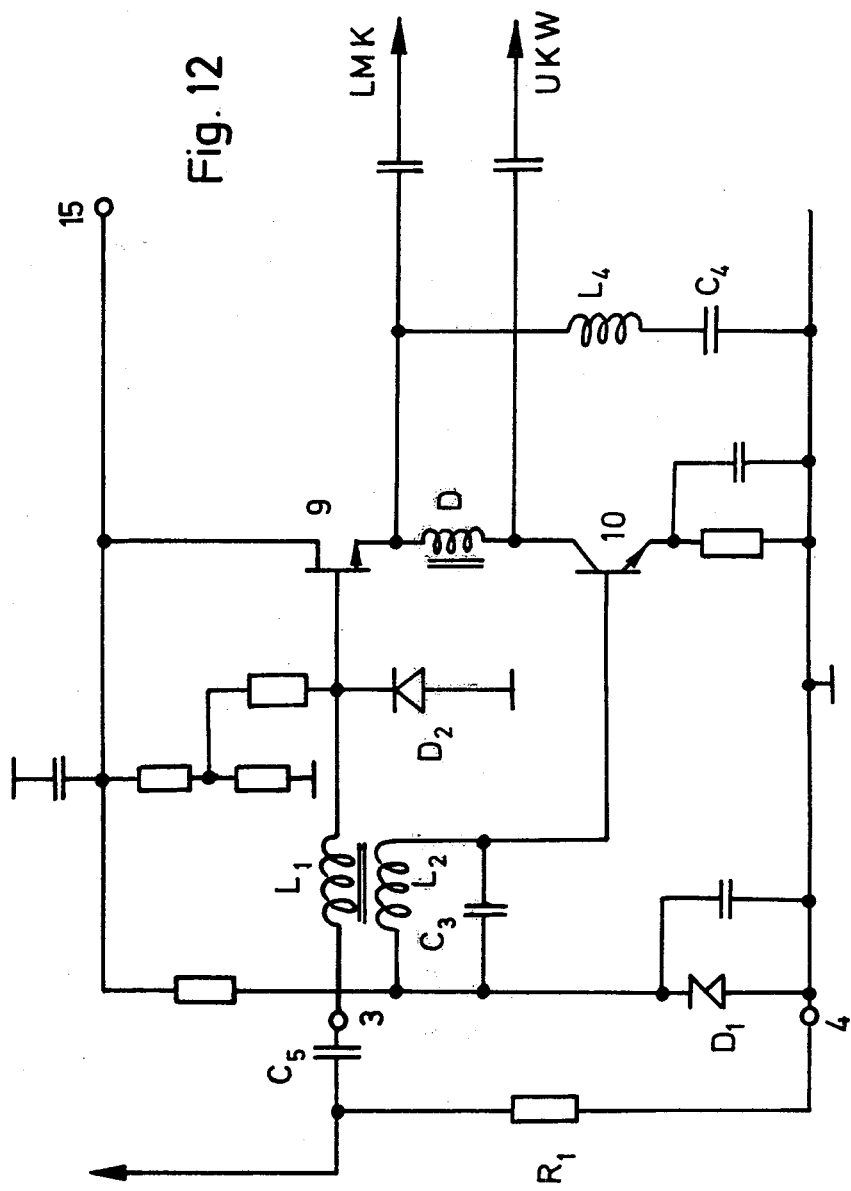

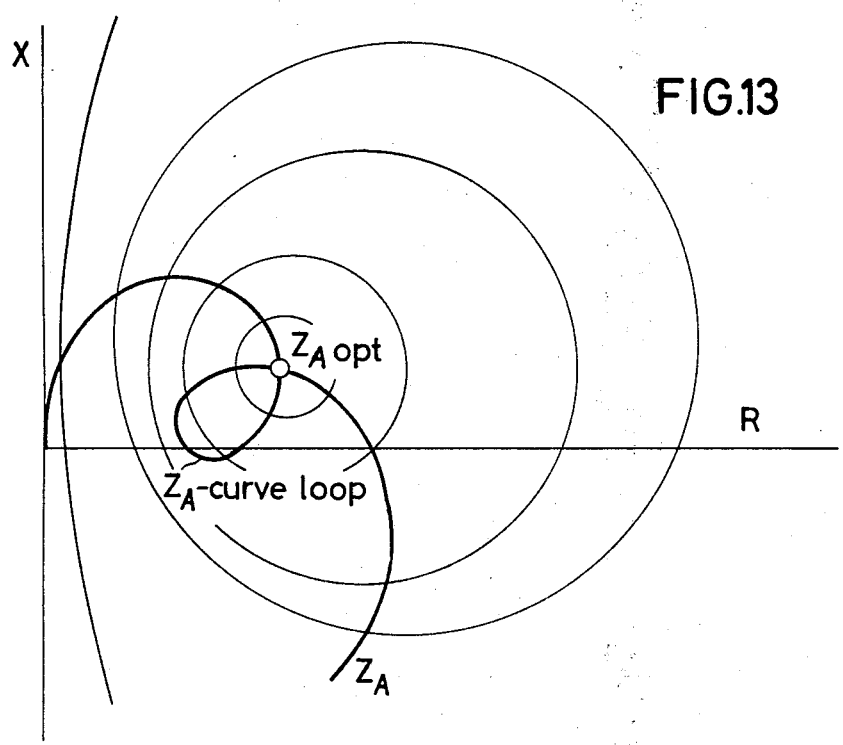

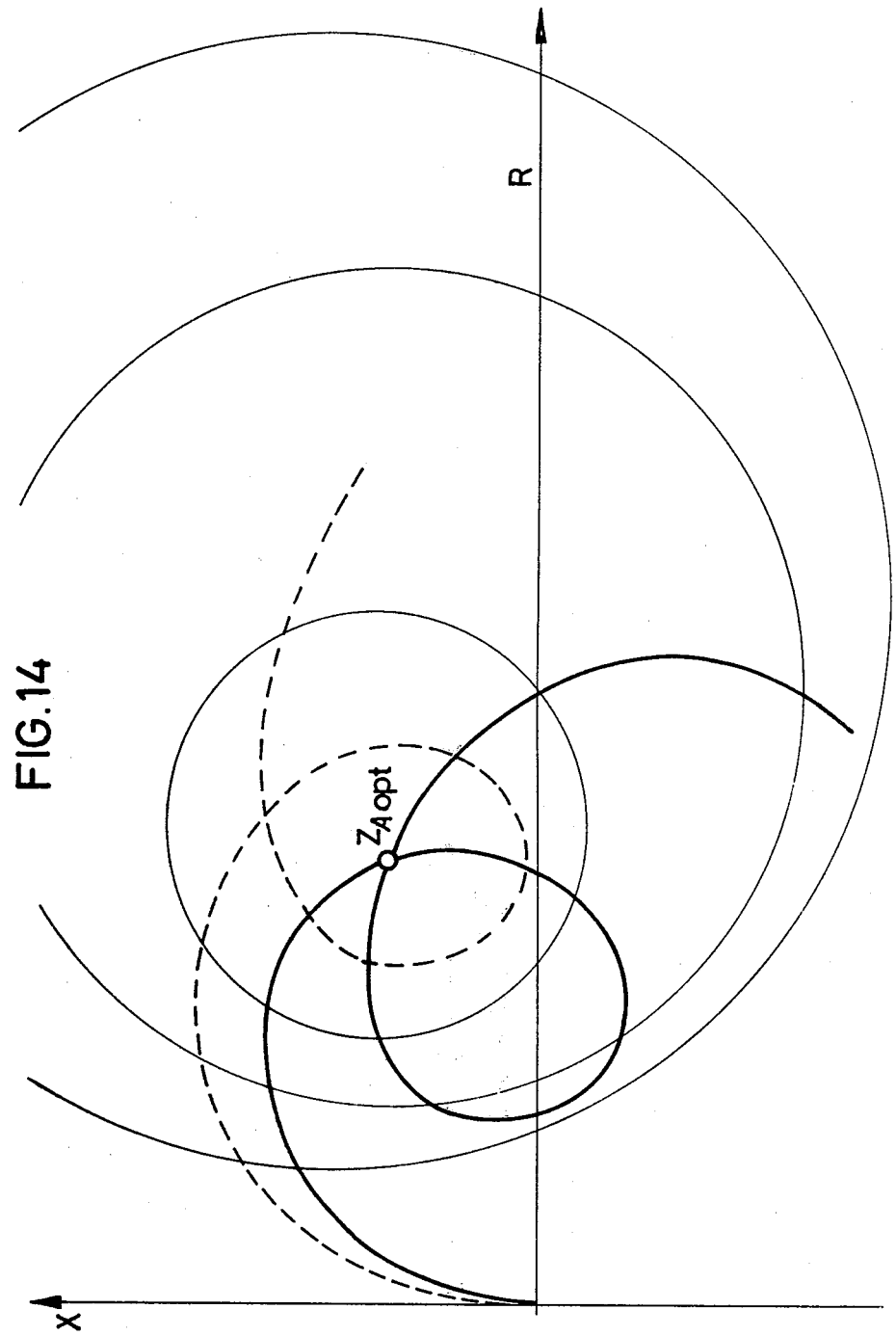

MULTIPLE-TRANSMISSION-CHANNEL ACTIVE ANTENNA ARRANGEMENT

The invention relates to a dipole or unipole receiving antenna operative for receiving signals in two distinct frequency ranges, with a separate transmission channel for each of the two frequency ranges being directly connected to the antenna. The best known examples of receiving antennas adapted to receive signals in two distinct frequency ranges are the antennas of radio receivers adapted to receive amplitude-modulated carrier signals having carrier frequencies in the broad range from 150 kHz to 30 MHz and adapted to also receive frequency-modulated carrier signals having carrier frequencies in a frequency range from 80 MHz to 110 MHz.

It is conventional to receive signals in these two distinct frequency ranges employing a single receiving antenna cooperating with two transmission channels, for example by providing in the receiver two different amplifiers. In U.S. Pat. No. 3,699,452, it was already proposed to connect the circuitry for the two separate transmission channels directly to an active antenna having a dipole characteristic. These two transmission channels can be connected in series as shown in FIG. 1 of the drawing, or in parallel as shown in FIG. 2 of the drawing. FIG. 1 depicts the principle according to which the two parts 1 and 2 of the dipole antenna are connected to terminals 3 and 4, to which in turn are connected two separate transmission channels 5 and 6 for the respective transmission of signals in the two different frequency ranges. A fundamental difficulty with this type of branching of the two transmission channels resides in the fact that each of the two transmission channels has a certain input impedance, which in FIG. 1 loads the input of the other transmission channel in series, and which in FIG. 2 loads the input of the other transmission channel in parallel, the loading in both cases being frequency-dependent.

With the example of a radio receiver antenna, at least in the range of lowest frequencies, the antenna is very short compared to the wavelengths of the received radiation, and as a result the unipole or dipole receiving antenna constitutes, as depicted in FIG. 3, a signal source $V_s$ having a high essentially capacitive internal impedance. With regard to operation of transmission channel 5 at low frequencies, the circuit performs as though there were connected directly across the terminals 3, 4 an impedance 6 (see FIG. 3) corresponding to the impedance of the transmission channel 6. With a high-ohmic internal impedance 8 of the source $V_s$ even a relatively small admittance of the impedance 6 can as a result of voltage division markedly diminish the open-circuit output voltage of the source and thereby reduce reception by transmission channel 5. This is particularly the case if the input impedance of the transmission channel 5 is a high-ohmic impedance matched to the high-ohmic internal impedance of the source, and, for example, for amplitude-modulated radio signals as frequency-independent as possible over a wide range of frequencies. An example of wideband reception of relatively low frequencies is the field-effect-transistor active rod antenna disclosed in West German Pat. application P 2,115,657. In the case of a high-ohmic source, the series arrangement of FIG. 1 is better employed than the parallel arrangement of FIG. 2. It is known that filters can be designed having very low input impedances in the attenuation band. A low impedance in series with a high-ohmic source is essentially easier to compensate for than a high-ohmic impedance connected in parallel to a high-ohmic source such as shown in FIG. 3.

It is a general object of the invention, in the frequency range of the lower frequencies, to keep as low as possible the loading of the high-ohmic receiving antenna by the series-connected transmission channel for the higher range of frequencies, so long as the antenna is operated in its lower frequency range.

This object can be met, according to one advantageous concept of the invention, in the manner depicted in FIG. 4. In FIG. 4, the transmission channel 5 associated with the lower frequency range has its input circuit connected across the antenna connector terminals 3, 4, and connected in series with the input circuit of transmission channel 5 is the primary winding L1 of a high-frequency transformer, the secondary winding L2 of which is connected across the input of the transmission channel 6 associated with the higher frequency range. As a result, the input impedance of the transmission channel 6, which is the transmission channel associated with the higher frequency range, is seen by transmission channel 5 as an impedance connected in series in the current path of primary winding L1 and having a low impedance value in the range of frequencies associated with transmission channel 5. This apparent impedance is small in the sense of the invention, if throughout the range of frequencies associated with transmission channel 5 it is smaller than the internal impedance of the receiving antenna. Of all the expedients known in the filtering art for this type of branching of transmission channels, the expedient according to the invention proves to be the one providing the best results.

Further features of the invention will be explained with reference to the following FIGS, in which FIGS. 1 and 2 depict arrangements of the prior art.

FIGS. 3 and 4 depict arrangements of the invention as discussed above.

FIG. 12 depicts an antenna having two transistorized transmission channels.

FIGS. 13 and 14 are plots in the complex impedance plane of the internal impedance of the antenna as reflected into the secondary winding circuit of FIG. 10, for example, and presented to the input terminals of transistor 10.

Figure 5A:
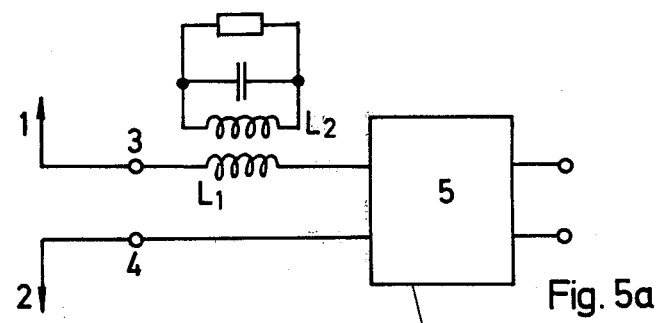
FIGS. 5a and 5b depict arrangements wherein resonance circuits are provided in the transformer secondary circuits.
Figure 5B:
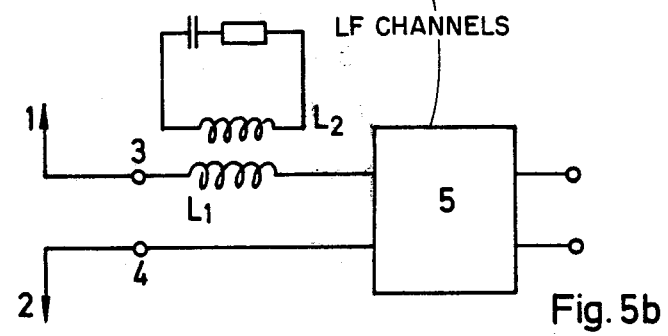

The illustrated embodiments make use of tuned or resonance transformers. Transformers provided with resonance circuitry in the secondary circuitry thereof are described in the publication "Einfuehrung in die Elektrotechnik hoeherer Frequenzen," Volume 1, of H. Meinke, page 80, published Berlin, 1965. When operating at low frequencies, if it is desired to keep low the influence of the transmission channel 6, it is first of all necessary to keep low the reactance $j\omega L_1$ in series with the input of the transmission channel 5; that is, L1 should be kept as small as possible. Furthermore, the coupling between L1 and L2 should be kept low, so that when operating at low frequencies the impedance of transmission channel 6, as reflected into the primary winding circuit, will remain low. On the other hand, when operating at high frequencies the signal power must be fully transmitted to the transmission channel 6. Such a transformer with low $L_1$ and low coupling is possible by establishing a resonance effect in the secondary circuit of the transformer, with the resonance frequency lying in the range of frequencies associated with the transmission channel 6. This can be achieved by using a combination of a capacitor and a resistor or the functional equivalent thereof, with the capacitor and resistor being connected in parallel as shown in FIG. 5a or in series as shown in FIG. 5b.

It is also contemplated according to the invention to provide an antenna for reception of carrier signals in more than two separate frequency ranges. By way of example FIGS. 6 and 7 depict antennas provided with three separate transmission channels 5, 6 and 7.

Figure 6:
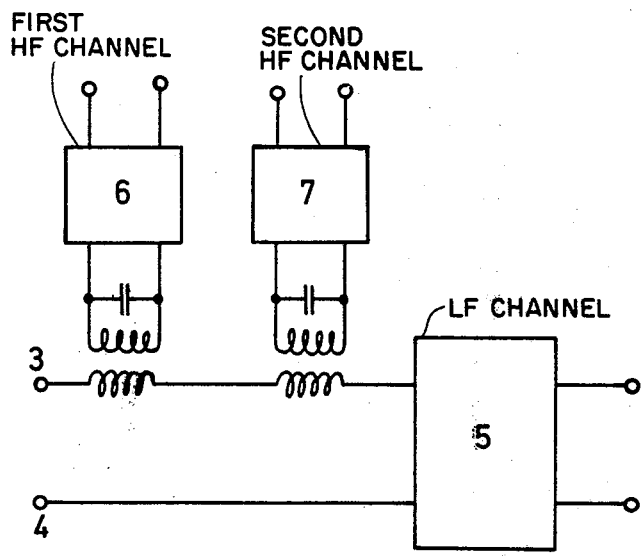
FIG. 6 depicts an arrangement having three transmission channels and two high-frequency coupling transformers.
Figure 7:
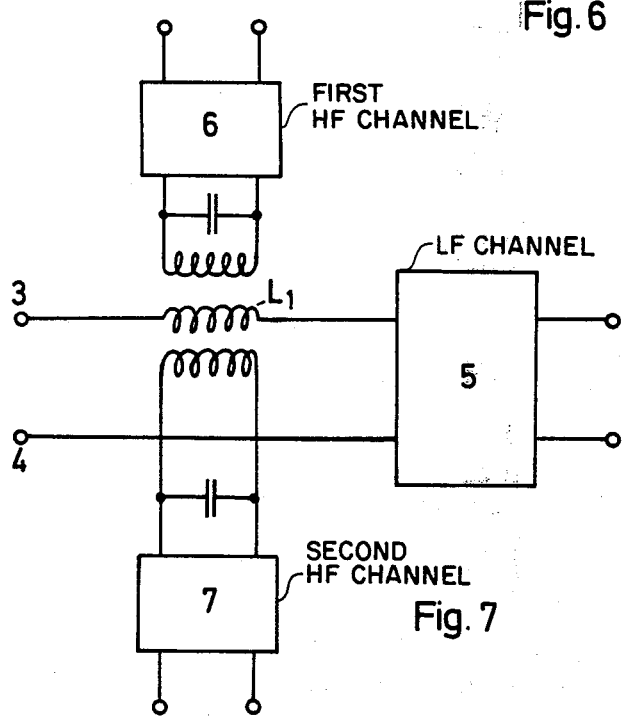
FIG. 7 depicts an arrangement having three transmission channels, one primary winding and two secondary windings.

In FIG. 6 the transmission channels 6 and 7, which are the ones associated with the two higher ranges of frequencies, are each provided with a transformer, the primary windings of the two transformers being connected in series, and the two transformers each having tuned secondary circuits, with the respective resonance frequency of each of the two transformers lying in the respective frequency ranges of frequencies of signals to be transmitted.

Figure 8A:
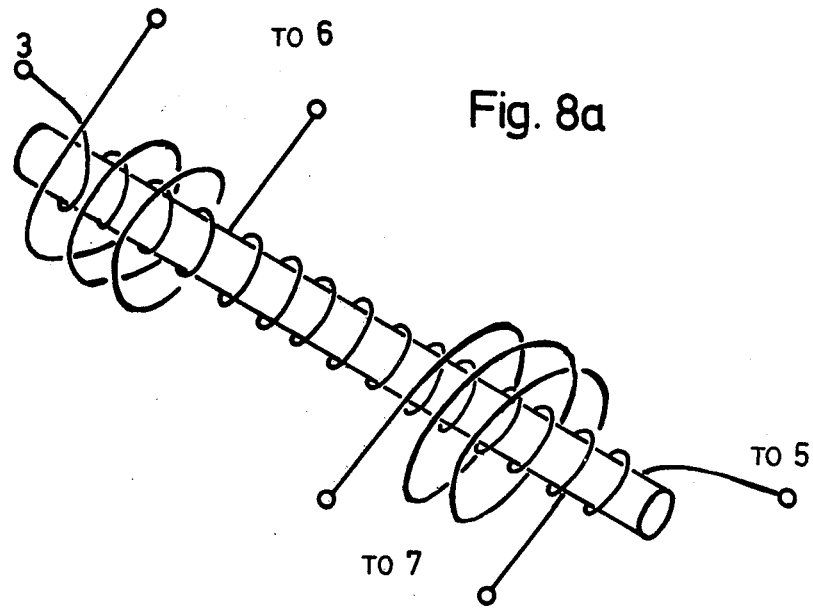
FIGS. 8a and 8b depict two different transformer arrangements each comprised of one primary winding and two secondary windings.
Figure 8B:
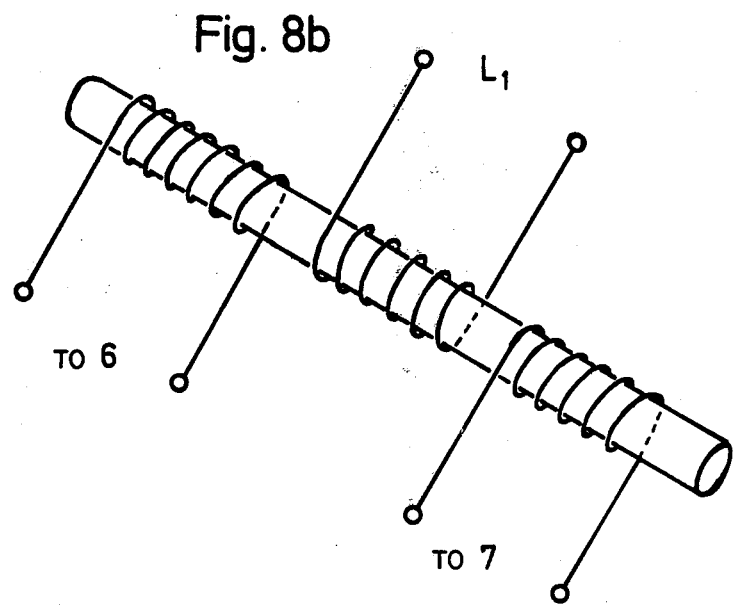

It is possible to reduce the expense involved in the use of more than two transmission channels by employing only a single primary winding and a plurality of secondary windings inductively coupled with the single primary winding. The secondary windings can be arranged as shown in FIG. 8a, wound around and over the end portions of the primary winding coil. It is essential with such an arrangement that the coupling between the two secondary windings be maintained low. It is advantageous to use for the transformer core a ferrite rod. If several secondary windings are to be employed, then it is possible to wind them all around a single ferrite core rod, as shown in FIG. 8b. When a ferrite core is employed, the axial spacing between the windings can be larger than possible with an air coupling, thereby maintaining low the undesired capacitive coupling between the various windings.

Figure 9:
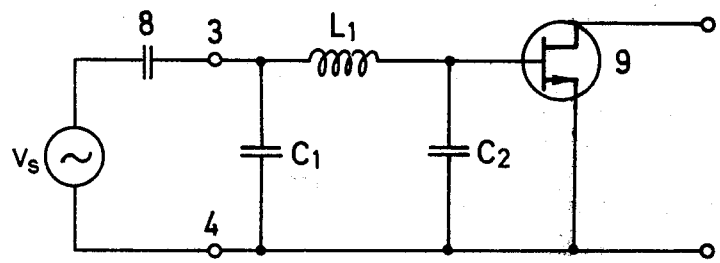
FIG. 9 depicts a field-effect-transistor circuit for the transmission channel associated with the lowest range of frequencies.

FIG. 9 depicts an advantageous embodiment of the invention in which use is made of a field-effect-transistor input circuit for the lowest-frequency transmission channel 5. Because of the high-ohmic internal impedance of the source, the illustrated circuit according to the invention, in the range of the lower frequencies, operates the better, the smaller are the currents which the antenna must supply; this is because the smaller the currents, the smaller is the voltage on L1, and the greater is the input voltage of the transmission channel 5. A field-effect-transistor, or a similar high-impedance electronic element, accordingly constitutes the best input for the transmission channel 5, because its input impedance in the range of the lower frequencies is a high-ohmic capacitive impedance. Such a low-loss capacitive character is the optimum form for the input of the low-frequency transmission channel when use is made of the series inductor $L_1$. This is because, in the case of a high-ohmic capacitance 8 of the internal impedance of the antenna (see FIG. 3) and a high-ohmic capacitive loading of the source by the field-effect-transistor 9, the series inductor L1 raises the input voltage of the transistor, as long as the operating frequency of the transmission channel 5 is lower than the resonance frequency of this input circuit. This special combination of reactances accordingly completely avoids the known disadvantages of branching transmission channels and even improves the transmission conditions from the antenna to the lower-frequency transmission channel.

A further improved form of the invention results by connecting the field-effect-transistor and the antenna to the connector terminals of the primary winding $L_1$ by means of leads having the shortest possible length and the least capacitive character, in order to keep as low as possible the cable capacitance symbolically depicted in FIG. 9 as two capacitors $C_1$ and $C_2$. The voltage division established by the capacitance $C_1$ and by the capacitance $C_2$, the undesirable effect of which was described with respect to the parallel impedance 6 shown in FIG. 3, can be reduced to the greatest possible extent by using a pair of leads having the shortest possible length and the least capacitive character.

The field-effect-transistor circuit makes it possible to tune the transformer primary winding circuit to a resonance frequency lying in the range of frequencies associated with the transmission channel transmitting the higher frequency signals. The advantage of tuning the transformer primary circuit is described in the above-identified publication of H. Meinke, on page 79. This primary circuit resonance can be established according to the invention by so selecting the inductance of the primary winding L1 that it, together will all the capacitors of the input circuit depicted in FIG. 9 (antenna capacitance, cable capacitance $C_1$, cable capacitance $C_2$ and input capacitance of the field-effect-transistor), determine the desired resonance frequency. The advantage of the primary circuit resonance resides in the fact that the coupling between the primary and secondary windings can be made smaller than in the absence of such resonance, and the impedance back reaction of the secondary side on the primary winding outside the resonance range—i.e., in the frequency range of the lower frequencies—is especially small. Primary circuit resonance and secondary circuit resonance can be employed independently of each other.

Figure 4:
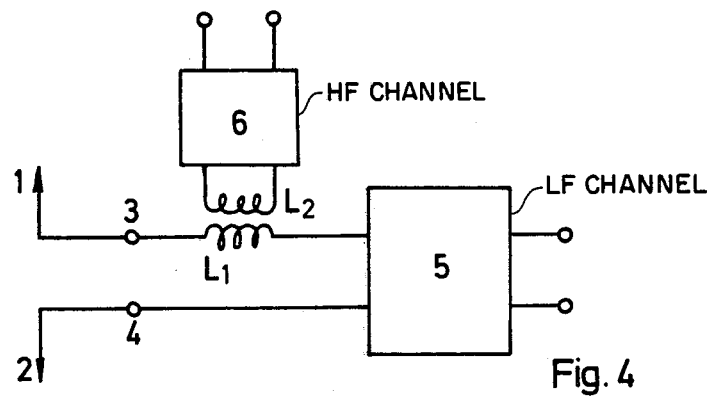
Figure 10:
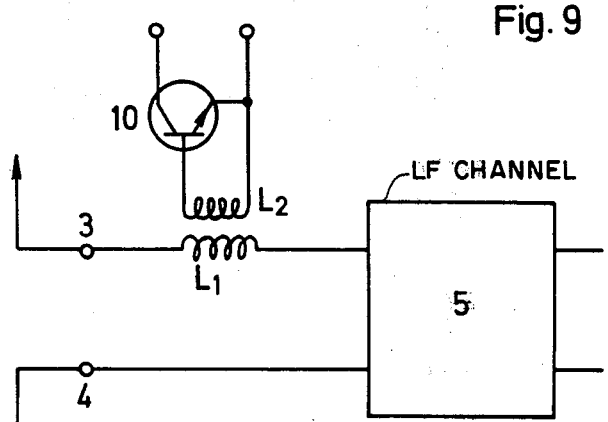
FIG. 10 depicts a transistor connected in the coupling transformer secondary circuit.

Additional advantages described below can be achieved if in the circuit of FIG. 4 the transmission channel 6 associated with the higher range of frequencies is provided with a transistor in its input circuit. Such a circuit, modified by inclusion of such a transistor 10, is depicted in FIG. 10. Transistors of all known types, and transistor circuits of all the conventional basic configurations, can be employed. With the present state of the art, it is preferred to employ for the higher frequencies bipolar transistors, preferably in common-base or common-emitter configuration, with the selection of the circuit configuration depending upon the particular application and the known characteristics of the different circuit configuration being exploited.

In many of these circuits the transistor 10 acts equivalently to the combination of a capacitor and a resistor as shown in FIG. 5. By suitably selecting the inductance of the secondary winding there can be established the already described secondary circuit resonance between the input capacitance of the transistor and the inductance of the secondary winding, possibly with the inclusion of further capacitors in such resonant circuit.

In the range of frequency associated with the high-frequency transmission channel, the antenna considered as a voltage source is connected to the input terminals of transistor 10 by means of the coupling transformer $L_1$, $L_2$. By adjusting the coupling between the primary and secondary windings of the transformer, it is possible to set to different values the internal impedance of the antenna, considered as a voltage source, as it appears when reflected into the input circuit of transistor 10, for example advantageously to such values that with a frequency in the frequency range of the higher-frequency transmission channel there is produced a noise matching between the voltage source (the antenna) and the transistor.

It is possible to use both the abovedescribed primary circuit resonance and also the abovedescribed secondary circuit resonance to gain advantages in addition to those mentioned above and characteristic of the combination of the two expedients. It is possible to still further reduce the coupling between the transformer windings, so that the reaction back of the transmission channel associated with the higher frequency range onto the transmission channel associated with the lower frequency range will be even further reduced, in such lower frequency range. These resonances are especially effective when the resonance frequencies of the two resonant circuits are equal or approximately equal. It is then particularly advantageous to so adjust the coupling between the primary and secondary resonant circuits to form a two-circuit critically coupled or slightly overcoupled broad-band filter. As a result, in known manner, the tuned transformer will have a broader and more uniform passband, compared to other forms of resonance.

It is advantageous for the selectivity and transmission effectiveness of the transmission channel 6 associated with the higher range of frequencies that the bandwidth of the bandpass filter correspond as exactly as possible to the just-mentioned higher range of carrier frequencies. If all the capacitances in the bandpass filter have values established in advance by the inherent characteristics of the antenna and of the transistor, and if furthermore the resonance frequency and consequently the inductances are fixed and the transformer coupling likewise is fixed by the requirement for critical coupling, then the bandwidth is determined and cannot be independently varied. In order to make adjustable the bandwidth and cutoff steepness of the filter bandpass curve, the circuit of FIG. 11 makes use of an additional capacitor element $C_3$ connected in parallel across the base-emitter junction of the transistor for setting the resonance of the secondary circuit including the additional capacitor. The ability to choose the capacitance value of this capacitor element will in many cases establish the degree of freedom necessary to meet specific bandwidth requirements.

In such a circuit it is also possible by suitable selection of the values of the electrical components to establish a noise matching between the antenna and the transistor 10 over a wide range of frequencies.

In this connection, reference should be had to FIGS. 13 and 14. With reference to FIG. 10, for example, the circles in FIGS. 13 and 14 are to be understood to be the lines of constant noise temperature of the arrangement across the base-emitter junction of transistor 10, at the median frequency of the frequency range associated with the respective transmission channel 6. Actually, the circles in FIGS. 13 and 14 are themselves frequency-dependent, so that for different frequencies, the circles would be somewhat differently located. However, as a simplifying assumption it can be assumed that the set of circular equal noise temperature lines shown in FIGS. 13 and 14 is approximately valid over the entire frequency range in question. These circles are associated with a specific transistor type, and if a different transistor type is employed, a different family of lines of constant noise temperature will result.

In FIGS. 13 and 14 $Z_A$ designates the complex impedance of the antenna, as reflected into the secondary circuit of the transformer and presented to the input terminals of transistor 10. The $Z_A$ curves in FIGS. 13 and 14 are plotted in the complex impedance plane. It will be noted that the single $Z_A$ curve of FIG. 13 and the two $Z_A$ curves of FIG. 14 each crosses over upon itself to form a closed loop. To achieve the best possible signal-to-noise ratio at the output terminals of transistor 10, the complex-plane impedance curve $Z_A$ should, in the first place, form this closed loop in the frequency range in question and, in the second place, the closed loop should be located in the vicinity of the impedance value associated with minimum noise temperature for the arrangement, designated $Z_{AOpt}$ and referred to herein as the optimal noise-matching impedance. In FIG. 13, the loop of the curve intersects $Z_{AOpt}$ at the peak of the loop. In FIG. 14, the crossover point of the solid-line $Z_A$ curve coincides with the $Z_{AOpt}$ point. In FIG. 14, the loop of the brokenline $Z_A$ curve encircles the $Z_{AOpt}$ curve. The advantages of the existance of the closed loop and of its proximity to the $Z_{AOpt}$ point are twofold. Firstly, $Z_A$ is not very frequency dependent along the closed loop. Since the frequencies of the closed loop correspond to the frequencies of the frequency range associated with transmission channel 6, the value $Z_A$ will be more or less frequency-in-dependent in the bandwidth of interest. Secondly, and clearly, the signal-to-noise ratio will be kept low in the frequency range of interest.

Figure 11:
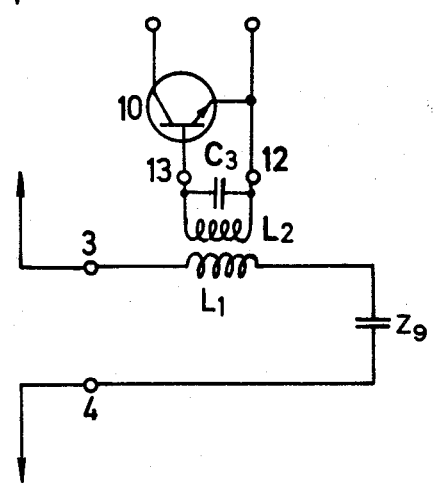
FIG. 11 depicts an arrangement similar to that of FIG. 10 but with an additional capacitor $C_3$ in the secondary circuit.

If for example the antenna is a unipole antenna and is not longer than a quarter-wavelength in the higher frequency range, then the circuit of FIG. 11 in the range of the higher frequencies constitutes a two-circuit transformer-coupled bandpass filter which when overcoupled is characterized in known manner by a looping curve in the complex impedance plane. By selecting the inductive coupling, by adjusting the resonance frequencies, and by correctly selecting the circuit capacitances, the looping curve in the complex impedance plane can be so shaped that in the abovedescribed range of operating frequencies optimum noise matching will be produced.

In West German Pat. application P 2,115,657, there is a disclosure of additional details of the circuit of the field-effect-transistor for the transmission channel 5 associated with the lower range of frequencies. These circuits can also be used in the case of the present antenna design, especially the expedient of low-noise linearization of the field-effect-transistor and the filtering out of the frequency range of the higher frequencies at the output side of the field-effect-transistor. FIG. 12 depicts the circuitry of a complete antenna unit, in which a series resonance circuit comprised of inductor $L_4$ and capacitor $C_4$ block the higher frequencies from the output of the transmission channel associated with the lower frequency range.

If the just-mentioned linearization expedient for the field-effect-transistor is also employed in the antenna according to the invention, there results the possibility to make double use of the transistor 10, firstly as an amplifier for the signals in the higher frequency range, and simultaneously to create and stabilize the D.C. current of the field-effect-transistor; that is, as transistor T of the circuit of FIG. 5 and of FIG. 6 of West German application P 21 15 657, FIG. 12 shows the complete circuit diagram of a thusly designed rod antenna. The D.C. current flowing through transistor 9 also flows through transistor 10, with the choke D connected between the output current paths of transistors 9, 10 preventing flow of the A.C. current of one transistor through the other transistor. The D.C. voltage at the base of transistor 10 is stabilized by the diode Dl. LMK in FIG. 12 designates the output for the amplified signal in the lower frequency range, whereas UKW designates the output for the amplified signal in the higher frequency range. The D.C. operating voltage for the circuit of FIG. 12 is applied across circuit junctions 4 and 15.

In the illustrated active antenna arrangement, the antenna parts connected to the terminals 3 and 4 contain no circuits capable of carrying currents. These two antenna parts can become electrostatically charged, as a result of electric fields in the atmosphere, or as a result of contact with charged bodies, or as a result of frictional electricity effects, and the resulting voltage build-ups may be applied to the input of the transmission channel for the lower range of frequencies. These voltage build-ups will constitute interference voltage signals in the transmission channel or may distort the response of sensitive transistors. To this end, the circuit of FIG. 12 is provided with a discharge resistor $R_1$. The resistor produces an additional noise which is the smaller, the greater the resistance value of the resistor. If a series capacitance $C_5$ is combined with this resistor in the line connecting the antenna to the transformer primary, the protection for the transmission channel 5 can be so satisfactorily designed that $R_1$ can be made so large that its noise is less than the intrinsic noise of the transmission channels.

It will be understood that each of the elements described above, or two or more together, may also find a useful application in other types of circuits and constructions differing from the types described above.

While the invention has been illustrated and described as embodied in an active antenna, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior are, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended

1. An active antenna arrangement comprising, in combination, a passive antenna structure having two output terminals and operative for receiving electromagnetic radiation and converting the same into electrical signals appearing across said two antenna output terminals; a first and a second transmission channel, each having a respective input comprised of a pair of input terminals and respectively operative for transmitting electrical signals having frequencies lying in a predetermined first frequency range and in a predetermined higher second frequency range, one of said input terminals of said first channel being connected to one of said two antenna output terminals; and transformer means comprising primary winding means connecting the other of said input terminals of said first channel to the other of said two antenna output terminals, secondary winding means connected across said two input terminals of said second transmission channel, and means forming a resonance at one of said frequency with one of said winding means said transformer means being operative when the frequency of the electrical signal across said antenna output terminals is in said first range for stepping down the input impedance of said second channel as reflected into the circuit of said primary winding means to a value lower than the value of the input impedance of said first transmission channel at such frequency.

2. An arrangement as defined in claim 1, wherein said secondary winding means and the input circuit of said second transmission channel together form a resonant circuit having a resonant frequency lying in said second range.

3. An arrangement as defined in claim 1; and further including a third transmission channel, having an input comprised of a pair of input terminals, and operative for transmitting electrical signals having frequencies lying in a predetermined third frequency range higher than said second range, and wherein said transformer means includes additional secondary winding means connected across the input terminals of said third transmission channel, and wherein said primary winding means comprises a single primary winding inductively coupled to the secondary winding means connected to said second channel and also inductively coupled to the secondary winding means connected to said third channel.

4. An arrangement as defined in claim 3, wherein each of said secondary winding means and the input circuit of the respective one of said second and third transmission channels together form a resonant circuit having a resonant frequency lying in the respective one of said second and third frequency ranges.

5. An arrangement as defined in claim 1; and further including a third transmission channel, having an input comprised of a pair of input terminals, and operative for transmitting electrical signals having frequencies lying in a predetermined third frequency range higher than said second range, and wherein said transformer means includes additional secondary winding means connected across the input terminals of said third transmission channel, and wherein said primary winding means comprises one primary winding inductively coupled to the secondary winding means connected to said second channel and a separate primary winding inductively coupled to the secondary winding means connected to said third channel.

6. An arrangement as defined in claim 5, wherein each of said secondary winding means and the input circuit of the respective one of said second and third transmission channels together form a resonant circuit having a resonant frequency lying in the respective one of said second and third frequency ranges.

7. An arrangement as defined in claim 5, wherein said transformer means comprises a ferrite core, both said primary windings and both said secondary winding means being wound around said ferrite core.

8. An arrangement as defined in claim 1, wherein the input impedance of said second transmission channel is predominantly that of the series connection of a resistance and a capacitance having such resistance and capacitance values as to form together with said secondary winding means a resonant circuit having a resonant frequency lying in said second range.

9. An arrangement as defined in claim 1, wherein the input impedance of said second transmission channel is predominantly that of the parallel connection of a resistance and a capacitance having such resistance and capacitance values as to form together with said secondary winding means a resonant circuit having a resonant frequency lying in said second range.

10. An arrangement as defined in claim 1, wherein said first transmission channel is provided in the input circuit thereof with an electronic amplifier element of high capacitive input impedance and having input terminals constituting said input terminals of said first transmission channel.

11. An arrangement as defined in claim 10, wherein said electronic amplifier element is a field-effecttransistor.

12. An arrangement as defined in claim 10, wherein said antenna, said primary winding means and said electronic amplifier element are connected together by electrical conductors exhibiting capacitance, and wherein the capacitance of said conductors, the capacitance of said antenna, the input capacitance of said electronic amplifier element and the inductance of said primary winding means have such values that said antenna, said primary winding means, said conductors and the input of said electronic amplifier element together form a resonant circuit having a resonant frequency lying in said second frequency range.

13. An arrangement as defined in claim 1, wherein said second transmission channel is provided in the input circuit thereof with an input transistor having input terminals constituting said input terminals of said second transmission channel.

14. An arrangement as defined in claim 13, wherein said input transistor exhibits input capacitance across said input terminals thereof, and wherein the value of said capacitance and the value of the inductance of said secondary winding means are such that the input of said transistor forms together with said secondary winding means a resonant circuit having a resonant frequency lying in said second frequency range.

15. An arrangement as defined in claim 13, wherein the coupling value between said primary winding means and said secondary winding means is such that the impedance value of said antenna when reflected by said transformer means into the circuit of said secondary winding means and presented to said input terminals of said transistor has a value equal to the optimum noisematching impedance value.

16. An arrangement as defined in claim 12, wherein said second transmission channel is provided in the input circuit thereof with an input transistor having input terminals constituting said input terminals of said second transmission channel, and wherein said input transistor exhibits input capacitance across said input terminals thereof, and wherein the value of said capacitance across said input terminals of said input transistor and the value of the inductance of said secondary winding means are such that the input of said transistor forms together with said secondary winding means a resonant circuit having a resonant frequency lying in said second frequency range, and wherein the resonant frequency of the resonant circuit comprised of said primary winding means is substantially equal to the resonant frequency of the resonant circuit comprised of said secondary primary means.

17. An arrangement as defined in claim 16, wherein the resonant circuit comprised of said primary winding means and the resonant circuit comprised of said secondary winding means together form a bandpass filter, and wherein the inductive coupling of said transformer means has such a value that the coupling between said two resonant circuits is approximately critical.

18. An arrangement as defined in claim 16, wherein the resonant circuit comprised of said primary winding means and the resonant circuit comprised of said secondary winding means together form a bandpass filter, and wherein the inductive coupling of said transformer means has such a value that the two resonant circuits are overcoupled.

19. An arrangement as defined in claim 17, wherein said second transmission channel is further provided at the input thereof with an input capacitor, whereby to permit selection of an input capacitance value of said second transmission channel to facilitate establishment of the resonant frequency of the resonant circuit comprised of said secondary winding means.

20. An arrangement as defined in claim 19, wherein the impedance of said antenna as reflected into the circuit of said secondary winding means and presented to the input terminals of said transistor is such that the plot thereof in the complex impedance plane has the shape of a curve crossing over itself to form a closed loop located in the vicinity of the optimal noise-matching impedance value.

21. An active antenna arrangement, comprising, in combination, an antenna having two output terminals and operative for receiving electromagnetic radiation and converting the same into electrical signals appearing across said two antenna output terminals; a first and a second transmission channel, each having a respective input comprised of a pair of input terminals, and respectively operative for transmitting electrical signals having frequencies lying in a predetermined first frequency range and in a predetermined higher second frequency range, one of said input terminals of said first channel being connected to one of said two antenna output terminals; and transformer means comprising primary winding means connecting the other of said input terminals of said first channel to the other of said two antenna output terminals, and comprising secondary winding means connected across said two input terminals of said second transmission channel, said transformer means being operative when the frequency of the electrical signal across said antenna output terminals is in said first range for stepping down the input impedance of said second channel as reflected into the circuit of said primary winding means to a value lower than the value of the input impedance of said first transmission channel at such frequency, wherein each of said first and second transmission channels is provided in the input circuit thereof with a respective electronic amplifier element having an output current path and having an input current path extending between two input terminals, the input terminals of the electronic amplifier element constituting the input terminals of the respective one of said transmission channels, and wherein the output current paths of the two electronic amplifier elements are connected in series so that substantially the same D.C. current flows through both of said output current paths.

22. An arrangement as defined in claim 21, wherein said output current paths are connected in series with a choke inductor having an inductance value large enough to substantially prevent A.C. current flowing through one of said output current paths from also flowing through the other of said output current paths.

23. An arrangement as defined in claim 1, wherein said antenna is provided with discharging resistor means connected across said two antenna output terminals.

24. An arrangement as defined in claim 23, and further including a capacitor having one terminal connected to said other one of said two antenna output terminals and having another terminal connected to one terminal of said primary winding means and connected in series with said primary winding means, said capacitor having a capacitance larger than the capacitance of said antenna, and said discharging resistor means comprising a discharge resistor having a resistance value such that the inherent noise of the discharge resistor is lower than the inherent noise of said transmission channels.

\* \* \* \* \*